United States Patent
Konstantinov

(10) Patent No.: US 9,515,176 B2
(45) Date of Patent: Dec. 6, 2016

(54) SILICON CARBIDE BIPOLAR JUNCTION TRANSISTOR INCLUDING SHIELDING REGIONS

(71) Applicant: Fairchild Semiconductor Corporation, San Jose, CA (US)

(72) Inventor: Andrei Konstantinov, Sollentuna (SE)

(73) Assignee: Fairchild Semiconductor Corporation, San Jose, CA (US)

(*) Notice: Subject to any disclaimer, the term of this patent is extended or adjusted under 35 U.S.C. 154(b) by 43 days.

(21) Appl. No.: 13/938,006

(22) Filed: Jul. 9, 2013

(65) Prior Publication Data
US 2013/0313571 A1 Nov. 28, 2013

Related U.S. Application Data

(63) Continuation of application No. PCT/EP2012/051606, filed on Jan. 31, 2012.
(Continued)

(30) Foreign Application Priority Data

Jan. 31, 2011 (SE) .................................... 11500659

(51) Int. Cl.
*H01L 29/66* (2006.01)
*H01L 29/73* (2006.01)
(Continued)

(52) U.S. Cl.
CPC ............. *H01L 29/73* (2013.01); *H01L 29/045* (2013.01); *H01L 29/06* (2013.01);
(Continued)

(58) Field of Classification Search
CPC .... H01L 29/73; H01L 29/66234; H01L 29/06; H01L 29/0611; H01L 29/66053; H01L 29/1608; H01L 29/1004; H01L 29/7325; H01L 29/66068; H01L 29/045
(Continued)

(56) References Cited

U.S. PATENT DOCUMENTS 4,483,738 A * 11/1984 Blossfeld ...................... 438/370
4,593,457 A *  6/1986 Birrittella ...................... 438/320
(Continued)

FOREIGN PATENT DOCUMENTS

EP         2192211 A1    6/2010
JP      2002-359378 A   12/2001
(Continued)

OTHER PUBLICATIONS

Ahmed, M.M.R. et al., "Characterization of the Static and Dynamic Behavior of a SiC BJT", 13th International Power Electronics and Motion Control Conference, 2008, 6 pages.
(Continued)

*Primary Examiner* — Phat X Cao
*Assistant Examiner* — Mohammad M Hoque
(74) *Attorney, Agent, or Firm* — Brake Hughes Bellermann LLP

(57) ABSTRACT

A silicon carbide (SiC) bipolar junction transistor (BJT) and a method of manufacturing such a SiC BJT is provided. The SiC BJT can include a collector region having a first conductivity type, a base region having a second conductivity type opposite the first conductivity type, and an emitter region having the first conductivity type, the collector region, the base region and the emitter region being arranged as a stack. The emitter region defining an elevated structure defined at least in part by an outer sidewall on top of the stack. The base region having a portion capped by the emitter region and defining an intrinsic base region where the intrinsic base region includes a portion extending from
(Continued)

the emitter region to the collector region. The SiC BJT can include a first shielding region and a second shield region each having the second conductivity type.

21 Claims, 4 Drawing Sheets

Related U.S. Application Data

(60) Provisional application No. 61/437,835, filed on Jan. 31, 2011.

(51) Int. Cl.
*H01L 29/04* (2006.01)
*H01L 29/10* (2006.01)
*H01L 29/16* (2006.01)
*H01L 29/732* (2006.01)
*H01L 29/06* (2006.01)

(52) U.S. Cl.
CPC ...... *H01L 29/0611* (2013.01); *H01L 29/1004* (2013.01); *H01L 29/1608* (2013.01); *H01L 29/66053* (2013.01); *H01L 29/66068* (2013.01); *H01L 29/66234* (2013.01); *H01L 29/7325* (2013.01)

(58) Field of Classification Search
USPC ................ 257/565, 592, 77, 586, 91, 92
See application file for complete search history.

(56) References Cited

U.S. PATENT DOCUMENTS

| | | | | |
|---|---|---|---|---|
| 4,966,860 | A | | 10/1990 | Suzuki et al. |
| 4,980,305 | A | * | 12/1990 | Kadota et al. ................ 438/363 |
| 4,996,581 | A | * | 2/1991 | Hamasaki ..................... 257/592 |
| 5,208,169 | A | | 5/1993 | Shah et al. |
| 5,324,672 | A | * | 6/1994 | Anmo et al. .................. 438/366 |
| 5,386,140 | A | * | 1/1995 | Matthews .......... H01L 29/1004 257/273 |
| 5,548,158 | A | * | 8/1996 | Bulucea ............ H01L 29/66272 257/558 |
| 6,121,633 | A | * | 9/2000 | Singh et al. .................... 257/77 |
| 6,278,143 | B1 | * | 8/2001 | Ejiri .................... H01L 27/0623 257/262 |
| 6,384,469 | B1 | * | 5/2002 | Chantre ........................ 257/565 |
| 6,514,779 | B1 | * | 2/2003 | Ryu .................... G01R 31/2831 257/E21.525 |
| 6,686,250 | B1 | * | 2/2004 | Kalnitsky ......... H01L 29/66242 257/E21.371 |
| 6,964,907 | B1 | * | 11/2005 | Hopper et al. ................ 438/318 |
| 2001/0011729 | A1 | | 8/2001 | Singh et al. |
| 2002/0000640 | A1 | * | 1/2002 | Zhu .................... H01L 29/0821 257/565 |
| 2002/0132435 | A1 | * | 9/2002 | Zampardi et al. ............ 438/312 |
| 2003/0157777 | A1 | | 8/2003 | Van Zeghbroeck et al. |
| 2003/0160302 | A1 | | 8/2003 | Sankin et al. |
| 2004/0235256 | A1 | * | 11/2004 | Arai .............................. 438/370 |
| 2004/0256613 | A1 | * | 12/2004 | Oda et al. ........................ 257/19 |
| 2007/0102834 | A1 | * | 5/2007 | Enicks et al. .......... 257/E29.193 |
| 2007/0262295 | A1 | * | 11/2007 | Enicks ............................. 257/19 |
| 2008/0230808 | A1 | * | 9/2008 | Aoki .................... H01L 29/161 257/197 |
| 2009/0057685 | A1 | | 3/2009 | Mochizuki et al. |
| 2013/0087808 | A1 | | 4/2013 | Konstantinov |

FOREIGN PATENT DOCUMENTS

| | | |
|---|---|---|
| WO | 2010/024239 A1 | 3/2010 |
| WO | 2010/024240 A1 | 3/2010 |
| WO | 2010/110725 A1 | 9/2010 |

OTHER PUBLICATIONS

Lee, Hyung-Seok et al., "High-Current-Gain SiC BJTs With Regrown Extrinsic Base and Etched JTE", IEEE Transactions on Electron Devices, vol. 55, No. 8, Aug. 2008, 5 pages.
Zhang, Jianhui et al., "A High Current Gain 4H-SiC NPN Power Bipolar Junction Transistor", IEEE Electron Device Letters, vol. 24, No. 5, May 2003, 3 pages.
International Search Report and Written Opinion for International Application No. PCT/EP2012/051606, mailed Apr. 18, 2012, 12 pages.
Written Opinion of the International Preliminary Examination Authority for International Application No. PCT/EP2012/051606, mailed Jan. 17, 2013, 6 pages.
International Search Report and Written Opinion for International Application No. PCT/SE2012/050097, mailed May 9, 2012, 10 pages.
Chapter II Demand filed Nov. 13, 2012, for International Application No. PCT/EP2012/051606, 20 pages.

\* cited by examiner

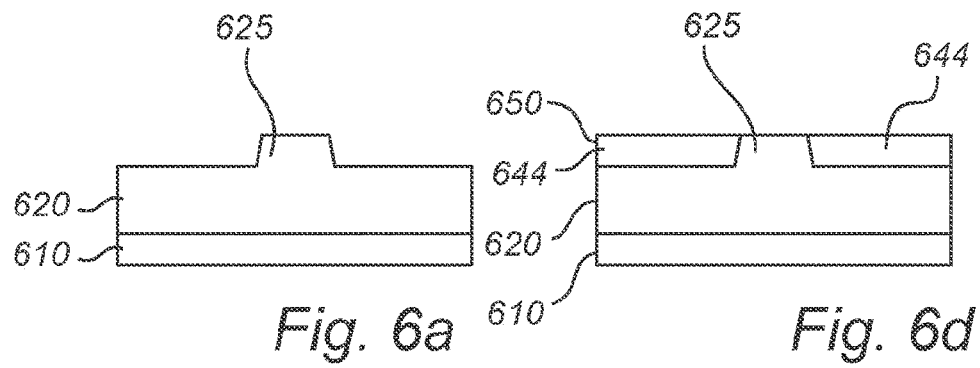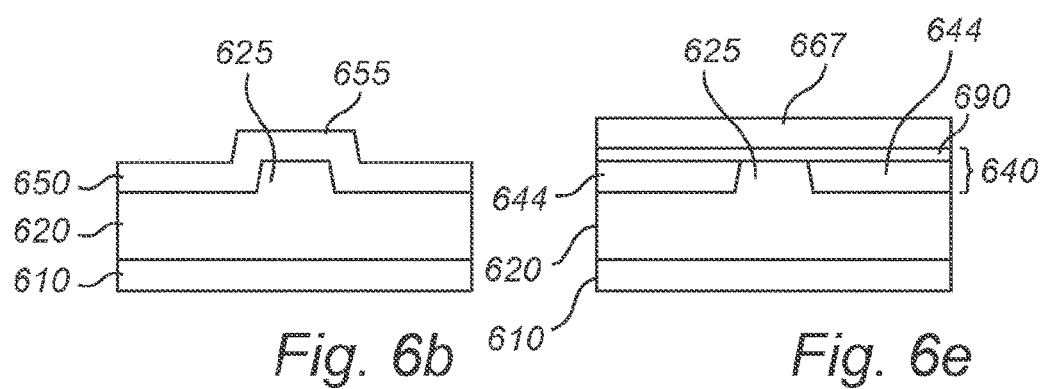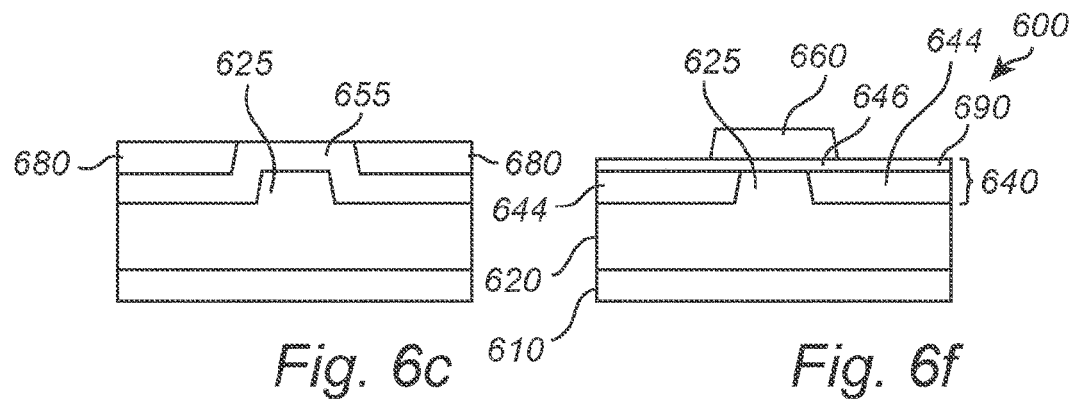

SILICON CARBIDE BIPOLAR JUNCTION TRANSISTOR INCLUDING SHIELDING REGIONS

CROSS REFERENCE TO RELATED APPLICATIONS

This application is a continuation of PCT Patent Application No. PCT/EP2012/051606, filed on Jan. 31, 2012, entitled, "Silicon Carbide Bipolar Junction Transistor Comprising Shielding Regions and Method of Manufacturing the Same", which claims priority to and the benefit of U.S. Provisional Patent Application No. 61/437,835, filed on Jan. 31, 2011, and priority to and the benefit of Swedish Application No. 1150065-9, filed on Jan. 31, 2011, all of which are incorporated herein by reference in their entireties.

BACKGROUND

Silicon carbide (SiC) bipolar junction transistors (BJTs) are high-performance power devices having low on-state and switching losses and are also capable of high-temperature operation thanks to the high breakdown electric field, high thermal conductivity and high saturated drift velocity of electrons in SiC. SiC is a wide bandgap semiconductor and may advantageously be used for manufacturing devices for high power, high temperature and high frequency applications.

In a high power bipolar junction transistor (BJT) comprising a collector region, a base region and an emitter region, the critical characteristics representative of the performance of the BJT are the common emitter current gain, the specific on-resistance and the breakdown voltage. For a specific doping concentration, the base region of the BJT is preferably as thin as possible in order to obtain a high current gain. However, the minimum thickness of the base region is limited by the base punch-through effect, which represents total depletion of the base region at a high collector bias. Referring to the doping of the base layer, on the one hand, a high breakdown field requires a high doping level in the base region of the BJT in order to prevent early punch-through while, on the other hand, a high doping level in the base region decreases the emitter current gain, which is a disadvantage in practical application. A drawback of prior art SiC BJTs is therefore that they do not simultaneously provide a sufficiently high emitter current gain and a sufficiently high blocking voltage.

Thus, there is a need for providing new designs of SiC BJTs and new methods of manufacturing such BJTs that would alleviate at least some of the above-mentioned drawbacks.

SUMMARY

This disclosure is related to alleviation of at least some of the above disadvantages and drawbacks of the prior art and to providing an improved alternative to prior art SiC BJTs.

Generally, the present disclosure is related to a SiC BJT with improved blocking capabilities while still providing a sufficient current gain. Further, the present disclosure is related to methods of manufacturing such a SiC BJT.

The present disclosure is related to a SiC BJT, a unit cell of a power semiconductor device and a method of manufacturing such a SiC BJT (or unit cell) having the features defined herein.

BRIEF DESCRIPTION OF THE DRAWINGS

The above features and advantages, will be better understood through the following illustrative and non-limiting detailed description of embodiments, with reference to the appended drawings, in which:

FIGS. 6A-6F illustrate a method of manufacturing a SiC BJT according to another embodiment.

Figure 1:
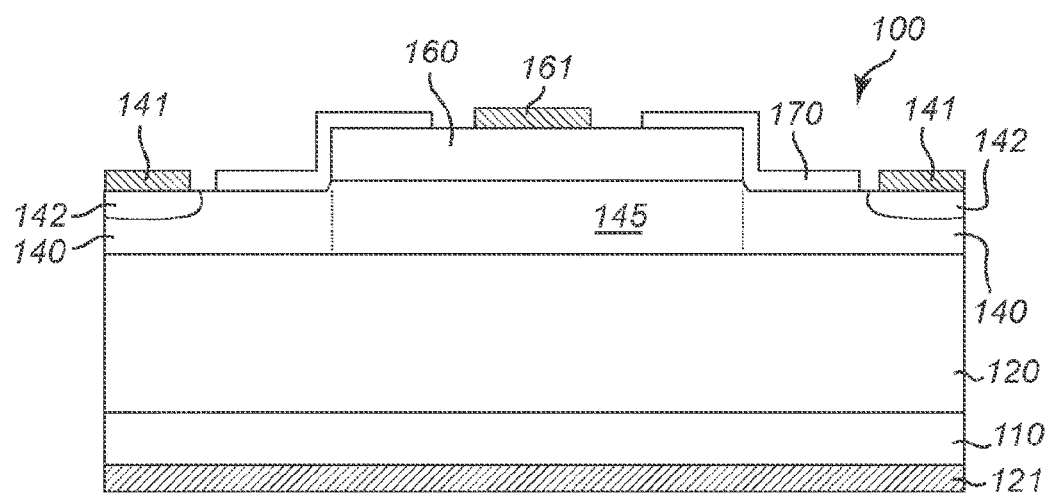
FIG. 1 shows a schematic cross-sectional view of a standard SiC BJT.

All the figures are schematic, not necessarily to scale, and generally only show parts which are necessary in order to elucidate the embodiments, wherein other parts may be omitted or merely suggested.

DETAILED DESCRIPTION

According to a first aspect, a SiC BJT is provided. The SiC BJT comprises a collector region having a first conductivity type, a base region having a second conductivity type opposite to the first conductivity type and an emitter region having the first conductivity type. The collector region, the base region and the emitter region are arranged as a stack, wherein the portion of the base region interfacing the emitter region defines the intrinsic base region. The intrinsic base region comprises a first portion having a first dopant dose and vertically extending from the emitter region to the collector region. The SiC BJT further comprises two shielding regions having the second conductivity type and a second dopant dose being higher than the first dopant dose. The shielding regions laterally surround (or are arranged on laterally opposite sides of) the first portion and vertically extend further down in the stack than (or relative to) the first portion.

According to a second aspect, a method of manufacturing a SiC BJT including a collector region having a first conductivity type, a base region having a second conductivity type opposite to the first conductivity type and an emitter region having the first conductivity type is provided. The collector region, the base region and the emitter region are arranged as a stack. The method comprises the steps of forming a base layer on a collector layer and forming an emitter layer on top of the base layer. The portion of the base layer interfacing the emitter layer defines the intrinsic base region, which comprises a first portion having a first dopant dose and vertically extending from the emitter layer to the collector layer. Further, two shielding regions are formed having the second conductivity type and a second dopant dose being higher than the first dopant dose. The shielding regions laterally surround the first portion and vertically extend further down in the stack than the first portion.

It will be appreciated that the collector, base and emitter layers form the collector, base and emitter regions, respectively, of the SiC BJT.

According to a third aspect, a unit cell of a power semiconductor device is provided. The unit cell comprises a first region having a first conductivity type, a second region having a second conductivity type opposite to the first conductivity type, and a third region having the first conductivity type. The first region, the second region and the third region are arranged as a stack, wherein the portion of the second region interfacing the third region defines an active region of the second region. The active region comprises a first portion having a first dopant dose and vertically extending from the third region to the first region. The unit cell further comprises two shielding regions having the second conductivity type and a second dopant dose being higher than the first dopant dose. The shielding regions laterally surround the first portion and vertically extend further down in the stack than the first portion.

The present embodiments use the concept of providing an electrostatic shielding of the first portion of the intrinsic base region (the active region) from the electric field caused by a high collector bias during off-state blocking conditions. During on-state conditions, i.e., when forward bias is applied over the pn junction formed by the emitter region and the base region (the base collector junction being reversed-biased), it is desirable to obtain a high current gain, which may be achieved by reducing the thickness and doping level of the base region. On the other hand, during off-state blocking conditions, it is desirable to obtain a high breakdown electric field (or high blocking voltage) for reducing the punch-through effect, i.e. reducing the risk of the base region being fully depleted. One factor increasing the punch-through effect is a reduced thickness and doping level of the base region. Hence, when determining the doping dose (via the thickness and/or doping level) of the base region, both the performance of the BJT during on-state and blocking conditions have to be considered. The punch-through effect is reduced by another factor, namely by the electrostatic shielding of the first portion obtained by the shielding regions, which reduces the risk of the base being fully depleted (punched through) during blocking conditions and thereby increases the blocking voltage of the BJT. With a reduced punch-through effect, the dopant dose (determined by the thickness and/or doping level) of the first portion of the intrinsic base region can be made lower, thereby resulting in an increased emitter current gain. Hence, the present embodiments provide a SiC BJT (and a unit cell) with improved blocking capabilities while still providing a sufficient current gain.

The electrostatic shielding is provided by the shielding regions having the second conductivity type (i.e., the same conductivity type as the first portion) and a higher dopant dose than the first portion, which shielding regions laterally surround the first portion and vertically extend further down in the stack than the first portion. The portion of the collector region (the third region) separating the shielding regions, i.e., the portion of the collector region arranged underneath the first portion and between the shielding regions, provides a channel (or opening) facilitating the on-state current flow through the first portion of the intrinsic base region during on-state conditions. Such a portion of the collector region may hereinafter be referred to as a channel portion.

A thinner and lower doped first portion of the base region has a lower Gummel number, i.e., a lower total acceptor charge, and is therefore more permeable to minority carrier diffusion, which increases the base transport factor and the current gain. The first portion of the intrinsic base region may also be referred to as a diffusion-permeable base portion.

In a standard planar BJT design, a thin and low-doped base might be unable to block a high voltage during off-state blocking conditions due to insufficient impurity charge (due to the low dopant dose). With the SiC BJT, a higher blocking voltage is achieved by electrostatic shielding of the first portion of the intrinsic base region from the electric field arising (at the base-collector interface) during blocking (off-state operation) conditions.

According to an embodiment, the shielding regions may vertically extend further down in the stack than the first portion by a distance corresponding to about 15% to 150%, preferably about 40% to 60%, and most preferably about 50%, of the width of the portion of the collector region (or third region) separating the shielding regions. The dimensions of the shielding regions and the portion of the collector region separating the shielding regions, i.e. the channel portion, influences the performance of the SiC BJT with respect to the electrostatic shielding during blocking conditions and the channel resistance to vertical current flow during on-state conditions (as the channel resistance is dependent on the cross section area and the thickness of the channel portion). It is desirable to obtain an increased electrostatic shielding during blocking conditions and a sufficiently low channel resistance to vertical current flow during on-state conditions. Shallower shielding regions (i.e. the vertical extension of the shielding regions further down in the stack relative to the vertical extension of the first portion corresponds to a smaller percentage of the width of the channel portion) provides less electrostatic shielding during blocking conditions and less channel resistance during on-state conditions. Deeper shielding regions (i.e. the vertical extension of the shielding regions further down in the stack relative to the vertical extension of the first portion corresponds to a greater percentage of the width of the channel portion) provides more electrostatic shielding during blocking conditions and more channel resistance. The present embodiment is advantageous in that the dimensions of the shielding regions and the channel portion are adapted to provide both an improved electrostatic shielding of the first portion during blocking conditions, thereby reducing the punch-through effect, and a sufficiently low channel resistance of the channel portion during on-state conditions.

According to an embodiment, the shielding regions may be epitaxially grown and/or ion implanted regions. Accordingly, in the method according to the second aspect, the step of forming the shielding regions may include a step of ion implantation and/or a step of epitaxially growing the shielding regions on the collector layer.

Epitaxially grown shielding regions are advantageous in that they provide higher minority carrier lifetimes in the epitaxially grown material as compared to that obtained by ion implanted regions since it is difficult to completely remove implantation damage in SiC even at the highest practically available temperature of damage annealing. However, ion implanted shielding regions may alternatively be used since the first (low-dose) portion of the intrinsic base region may preferably provide a major part of the minority carrier flow from the emitter region to the collector region due to its lower dopant dose, thereby making the minority carrier flow in the shielding regions less critical. Ion implanted shielding regions are advantageous in that the manufacturing of the SiC BJT is facilitated as it reduces the number of etching and growth steps and operations associated therewith. The ion implantation may be made in portions of the collector region laterally surrounding the first portion, thereby reducing the need of an additional layer for forming the shielding regions. The ion implanted shielding portions may be arranged at each side of the first portion, such that the channel portion of the collector region is laterally surrounded by the ion implanted shielding regions. Further, a combination of epitaxially grown and ion implanted regions may also be used for providing shielding regions with convenient dimensions and dopant doses.

Referring now in particular to the second aspect, the method may include the steps of forming an elevated mesa structure in the collector layer and epitaxially growing a shielding layer (i.e. a layer for providing the shielding regions) on the collector layer, whereby an elevated mesa structure is formed in the shielding layer. The method may further include the steps of forming a sacrificial layer on the non-elevated portions of the shielding layer (i.e. the portions laterally surrounding the mesa structure of the shielding layer) and removing the sacrificial layer and the elevated portion of the shielding layer by etching down to the elevated portion of the collector layer. Further, a base layer may be formed on top of the shielding layer and the elevated portion of the collector layer and an emitter layer may be formed on the base layer. The present embodiment is advantageous in that the shielding regions are epitaxially grown, which provides higher minority carrier lifetimes in the shielding regions.

According to an embodiment, the shielding regions may laterally extend from the first portion outside the intrinsic base region. The shielding regions may thus laterally extend from the first portion into the extrinsic base region of the SiC BJT. The present embodiment is advantageous in that the electrostatic shielding of the first portion is improved due to the increased lateral extension of the shielding regions outside the intrinsic base region.

According to an embodiment, the emitter region may form an elevated structure defined by outer sidewalls on top of the stack, and the first portion may be laterally spaced away from the outer sidewalls of the emitter by portions of the shielding regions. The present embodiment is based on the understanding that the first portion may advantageously be laterally spaced away from the outer sidewalls of the emitter region by portions of the shielding regions (which portions thereby act as spacing portions/regions) having a higher dopant dose. The inventor has realized that in prior art SiC BJTs the punch-through effect in the base region may principally originate in the zone where the edges of the intrinsic base region and the outer sidewalls of the emitter region coincide. By providing a spacing portion (formed by the portion of the shielding region laterally separating the first portion from the outer sidewalls of the emitter region) having, in comparison to the first portion, a higher dopant dose, the punch-trough effect is further reduced. With the present embodiment, the first portion of the intrinsic base region, which first portion may be referred to as the active portion of the intrinsic base region, does not intersect the outer sidewalls of the emitter region where the punch-through effect is enhanced (due to e.g. over-etching of the emitter region as in prior art BJTs). By laterally spacing the low-dose intrinsic base region (i.e. the first portion) with a certain distance from the outer sidewalls of the emitter region (defined by etching in an emitter layer), an improved blocking voltage is achieved. In the present embodiment, the lateral boundaries of the first portion do not coincide with the outer sidewalls of the emitter region. During operation (i.e. under application of a bias), the SiC BJT of the present embodiment presents a higher charge in the spacing portion of the shielding region than in the first portion of the intrinsic base region.

According to an alternative embodiment, the first portion may form the intrinsic base region, whereby the first portion may laterally extend all the way to (but preferably not into) the extrinsic base region.

According to an embodiment, the shielding regions may form a part of the base region. The base region may thus comprise a low-dose portion formed by the first portion arranged in the intrinsic base region and a high-dose portion formed by the shielding regions laterally surrounding the low-dose portion.

According to an embodiment, the stack may be provided on a substrate having an off-axis orientation comprised in the range of about 2 to 4 degrees and wherein a defect termination layer (DTL) may be arranged between the substrate and the collector region. The DTL may have a thickness comprised in the range of 12 to 30 micrometers and a doping level comprised in the range of $2\times10^{18}$ cm$^{-3}$ to $2\times10^{19}$ cm$^{-3}$. The present embodiment is advantageous in that it improves the stability of the SiC BJT. With the DTL, the SiC BJT is less sensitive to degradation in the course of operation due to e.g. propagation of defects such as base plane dislocations.

According to an embodiment, there is provided a SiC power device comprising a plurality of SiC BJTs as defined in any one of the preceding embodiments. The BJTs may be arranged as a one- or two-dimensional array and connected to each other via interconnecting means.

Further features of, and advantages with, the present disclosure will become apparent when studying the following detailed disclosure, the drawings and the appended claims. Those skilled in the art realize that different features of the present disclosure can be combined to create embodiments other than those described in the following. In particular, it will be appreciated that the various embodiments described for the SiC BJT are all combinable with the method as defined in accordance with the second aspect.

FIG. 1 shows a SiC BJT 100 comprising a substrate 110 on which a collector layer 120, a base layer 140 and an emitter layer 160 have been grown. In the case of a NPN SiC BJT, the epitaxial structure may normally comprise a low-doped n-type collector layer 120 grown on top of a highly doped n-type substrate 110, a p-type base layer 140 and a highly doped n-type emitter layer 160. After epitaxial growth, the emitter region and the base region are defined using dry etch techniques, thereby providing an elevated emitter region 160. A dielectric layer 170 may be formed, e.g. by deposition of an oxide, at the edge of the elevated emitter region 160 (or emitter mesa). The dielectric layer 170 is advantageous for suppressing, or at least reducing, and stabilizing the surface recombination of minority carriers. Ohmic contacts 161 and 141 are formed to the emitter region 160 and the base region 140, respectively, and a collector Ohmic contact 121 may be formed at the back side of the substrate 110. The Ohmic contact 141 to the base region 140 may be improved by providing a region 142 having an increased acceptor doping using e.g. selective ion implantation followed by a subsequent high-temperature anneal before forming the contact 141. The portion of the base layer 140 located under the emitter mesa 160, i.e. within the outline of the emitter edge, is conventionally referred to as the intrinsic base region (or active base region) 145 while the portion of the base layer 140 not capped with the emitter region 160 is conventionally referred to as the extrinsic base region (or passive base region).

High power high speed switching applications require however new designs. In particular, it would be advantageous to provide new designs providing SiC BJTs with improved blocking capabilities while still maintaining a sufficiently high emitter current gain.

Figure 2:
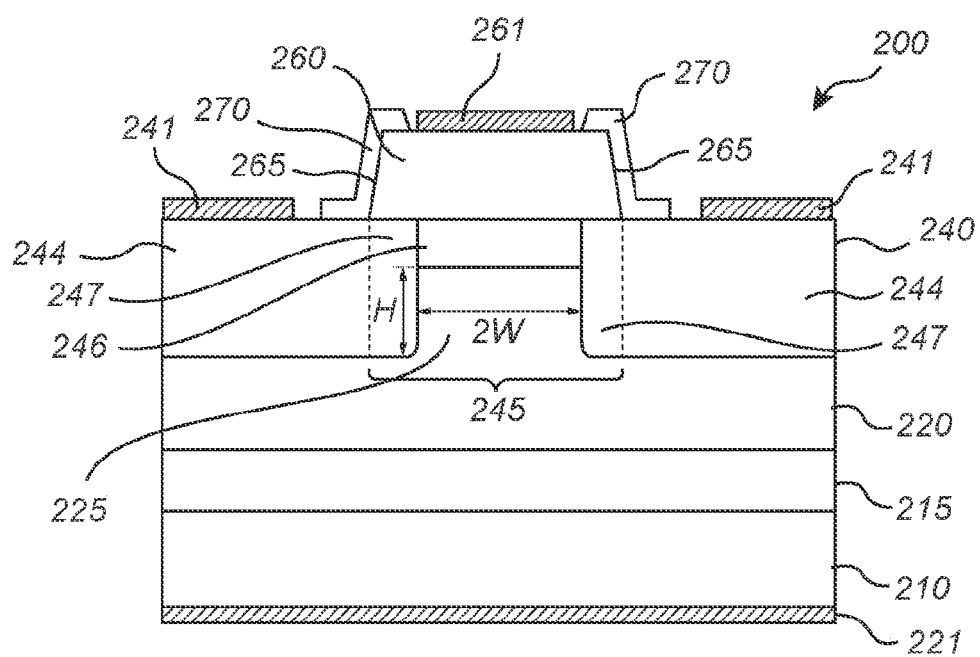
FIG. 2 shows a schematic cross-sectional view of a SiC BJT in accordance with an exemplifying embodiment.

With reference to FIG. 2, there is shown a schematic view of a SiC BJT in accordance with an exemplifying embodiment.

FIG. 2 shows a SiC BJT 200 comprising a substrate 210 on which a collector region 220, a base region 240 and an emitter region 260 are arranged as a stack. The collector region 220, the base region 240 and the emitter region 260 may be grown by epitaxy, as will be further explained below. The SiC BJT 200 shown in FIG. 2 may be a NPN SiC BJT, such as described above in connection to FIG. 1, i.e. with a low-doped n-type collector layer 220 grown on top of a highly doped n-type substrate 210, a p-type base layer 240 and a highly doped n-type emitter layer 260. After patterning (via e.g. photolithography and etching techniques) of the emitter layer, the emitter region 260 forms an elevated structure, or mesa structure, defined by outer sidewalls 265 on top of the stack. Optionally, the SiC BJT 200 may further comprise a defect termination layer, DTL, 215 (preferably of n-type) between the substrate 210 and the collector region 220 for suppressing bipolar degradation. Further details about the DTL are further disclosed in Swedish patent application SEI 051137-6 and U.S. provisional patent application 61/408,173 by the same assignee, the disclosure of which is herein enclosed by reference.

Further, the SiC BJT 200 comprises an intrinsic base region 245 corresponding to the portion 245 of the base region 240 interfacing the emitter region 260 (i.e. the portion of the base region 240 being capped by the emitter region 260), which intrinsic base region 245 includes a first portion 246 having a first dopant dose. Although for commodity reasons the reference sign 245 indicating the intrinsic base region has been placed in the collector region 220 on the drawing, it will be appreciated that the intrinsic base region 245 refers to the portion of the base region 240 interfacing the emitter region 260, as defined above. The SiC BJT 200 further comprises two shielding regions 244 having a second dopant dose being higher than the first dopant dose. The shielding regions 244 are arranged at laterally opposite sides of the first portion 246, such that they laterally surround the first portion 246, and vertically extend further down in the stack than the first portion 246. As the shielding regions 244 extend deeper into the collector region 220 than the first portion 246, an intermediate portion of the collector region 220 between the shielding regions 244 provides a channel portion 225 of the collector region 220. Hence, the channel portion 225 is the portion of the collector region 220 laterally reaching from one shielding region 244 to the opposite shielding region 244 and vertically from underneath the first portion 246 (i.e. the interface between the first portion 246 and the collector region 220) to the underside (i.e. the lower boundary) of the shielding regions 244. The shielding regions 244 are of the same conductivity type as the first portion 246, and may preferably form a part of the base region 240 of the SiC BJT 200, which in the present example with an NPN SiC BJT means that the shielding regions 244 are p-type regions. The first portion 246 of the intrinsic base region 245 is thus thinner than the remaining part of the base region 240, and in particular, than the portions of the base region 240 forming the shielding regions 244. Thus, using a base layer having a relatively uniform doping level, the dopant dose of the base region 240 in the first portion 246, i.e. in its active portion, is decreased by reducing the thickness of the first portion 246 relative to the shielding regions 244. As a result, the electrical charge in the first portion 246 is reduced as compared to the electrical charge in the shielding regions 244.

During on-state conditions, the current transport will predominantly occur through the channel portion 225 (i.e. through the opening between two shielding regions 244) and the first (low-doped) portion 246 of the intrinsic base region 245, whereas the contribution of injection current through the shielding regions 244 (i.e. the high-dose portions of the base region 240) to the total collector current will be low. A higher current gain of the SiC BJT 200 may thus be achieved due to the lower doping level of the first portion 246. The main function of the shielding regions 244 is to shield the first (low-dose) portion 246 from the electric field (at the base-collector interface) caused by high collector bias during blocking conditions, whereby the first portion 246 becomes less depleted, or even non-depleted and the punch-through effect is reduced.

The shielding effect depends on the dimensions of the shielding regions 244 and the channel portion 225 defined by the shielding regions 244. Shallower shielding regions 244 and a wider channel portion 225 (W>>H, where H is the height and W is half the width of the channel portion 225) provide less shielding effect and less channel resistance to vertical current flow, while deeper shielding regions 244 and a narrower channel portion 225 (W<<H) provide more shielding effect and more channel resistance to vertical current flow. Therefore, the shielding regions 244 may vertically extend further down in the stack than the first portion 246 by a distance corresponding to about 15% to 150%, preferably about 40% to 60%, and most preferably about 50%, of the width of the portion 225 of the collector region 220 separating the shielding regions 244. In other words, the aspect ratio, H/W, of the channel portion 225 may preferably be about ⅓ to 3, and most preferably about 1 for providing both sufficiently high shielding effect and sufficiently low channel resistance.

Figure 3:
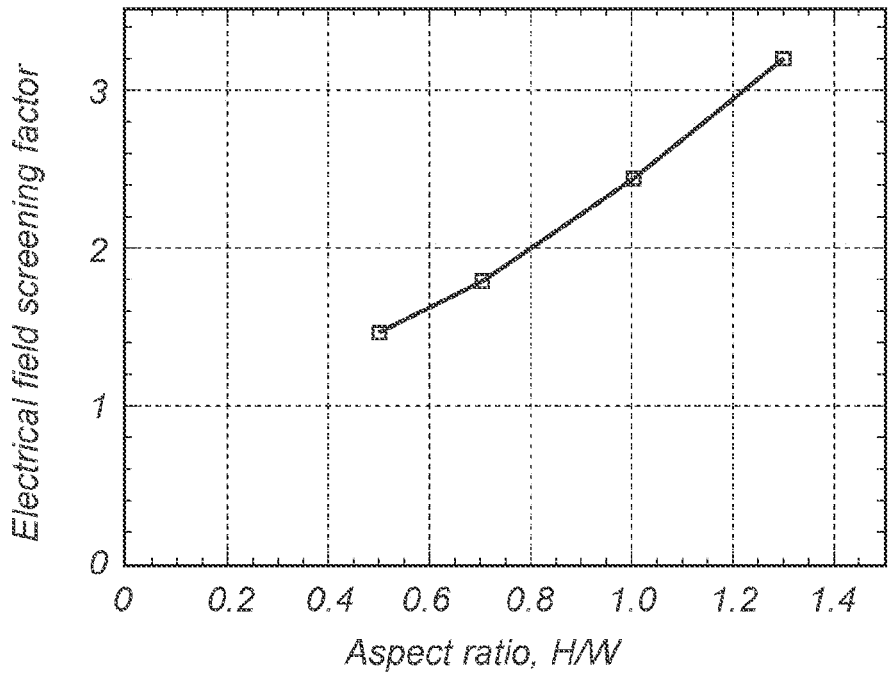
FIG. 3 shows the relation between the electric field screening factor and the aspect ratio of a channel portion of the BJT according to an embodiment.

The optimum aspect ratio H/W of the channel portion 225 however depends on the desired characteristics of the SiC BJT. A higher aspect ratio H/W allows a thinner base region having a lower acceptor doping, whereby a higher current gain is achieved. On the other hand, a lower aspect ratio H/W of the channel portion 225 results in a lower channel resistance and lower forward voltage drop. Thus, the device characteristics may be adapted according to the desired performance of the SiC BJT. FIG. 3 shows the simulated dependence of the electrical filed screening factor, which represents the efficiency of the shielding action for the shielding regions 244, as a function of the aspect ratio H/W for a SiC BJT having a 2 μm wide channel portion 225 (i.e., W=1 μm). The electrical field screening factor, which also may be referred to as $F_{scr}$, is the ratio of the maximum electric field in the center of a shielding region 244 to the maximum electric field in the center of the channel portion 225. In the simulation illustrated in FIG. 3, the electrical field screening factor was numerically calculated using a commercially available TCAD (Technology CAD) program for a voltage equal to the theoretical avalanche breakdown voltage of the SiC BJT. The thickness and doping of the collector region were set to 10 μm and $9 \times 10^{15}$ cm$^{-3}$, respectively. As can be seen in FIG. 3, the electrical field screening factor, i.e. the shielding effect, increased with an increases aspect ratio H/W.

For a conventional SiC BJT (as shown in FIG. 1) the lowest limit for the base dose is determined by the punch-through of the base at a high blocking voltage. According to Gauss Law such a dose is approximately:

$$Q_{aval} = \in \times \in_0 \times E_{aval}/q \qquad \text{Equation 1}$$

where $\in_0$ is the dielectric constant, $\in$ the permittivity of SiC, q the electron charge and $E_{aval}$ is the avalanche breakdown field, which is in the range of 2-3 MV/cm in SiC for the breakdown voltages relevant for high power devices. $Q_{aval}$ may therefore be in the range between $1.1 \times 10^{13}$ and $1.6 \times 10^{13}$ acceptors per cm$^2$ depending on the required blocking voltage of the base-collector junction.

A conventional SiC BJT using a base acceptor dose lower than $Q_{aval}$ will not reach the theoretical limit for blocking voltage that is set by the avalanche breakdown and the base region will be fully depleted (punched through) at a lower voltage. The punch-through effect is however reduced thanks to the shielding regions 244 and therefore a lower acceptor dose can be used for the first portion 246 of the base region 240 with a reduced risk for the base punch-through. The emitter current gain of a BJT has a reciprocal dependence on the acceptor dose in the base region, whereby the SiC BJT has a higher current gain than a conventional SiC BJT while retaining a higher current blocking voltage.

The acceptor dose in the first (low-dose) base portion may be decreased by approximately the factor of $F_{scr}$ as compared to the acceptor dose of a base of a conventional planar SiC BJT. An even greater decrease of the acceptor dose in the base may be achieved if the off-state conditions are maintained by applying reverse bias to the base-emitter junction. The minimum dose of acceptors in the shielding regions 244 may preferably exceed $Q_{aval}$.

According to an embodiment, the first portion 246 may be laterally spaced away from the outer sidewalls 265 of the emitter region 260 by portions 247 of the shielding region 244, hereinafter referred to as spacing portions 247, as shown in FIG. 2. As a result of the electrical charge of the first portion 246 being reduced as compared to the electrical charge of the spacing portion 247 of the shielding region 244 (due to the first dopant dose being lower than the second dopant dose) the risk of punch-through in the vicinity of the outer sidewalls or edges 265 of the emitter region 260 is reduced thanks to the spacing portions 247. The dopant dose of the spacing portions 247 may be further adjusted relative to the dopant dose of the first portion 246 by adjusting the doping level in the shielding regions 244, or at least locally adjusting the doping level in the spacing portions 247 of the shielding regions 244.

It will be appreciated that the SiC BTJ 200 may further include Ohmic contacts to the collector region 220 via e.g. a contact layer 221 at the backside of the substrate 210, a contact layer 241 to the base region 240 and a contact layer 261 to the emitter region 260. Further, a dielectric coating 270, such as an oxide, may be provided at the sidewalls 265 of the emitter region 260, and optionally covering also a part of the top portion of the emitter region 260, which is advantageous in that it reduces surface recombination and thereby further improves the current gain of the SiC BJT 200.

Figure 4:
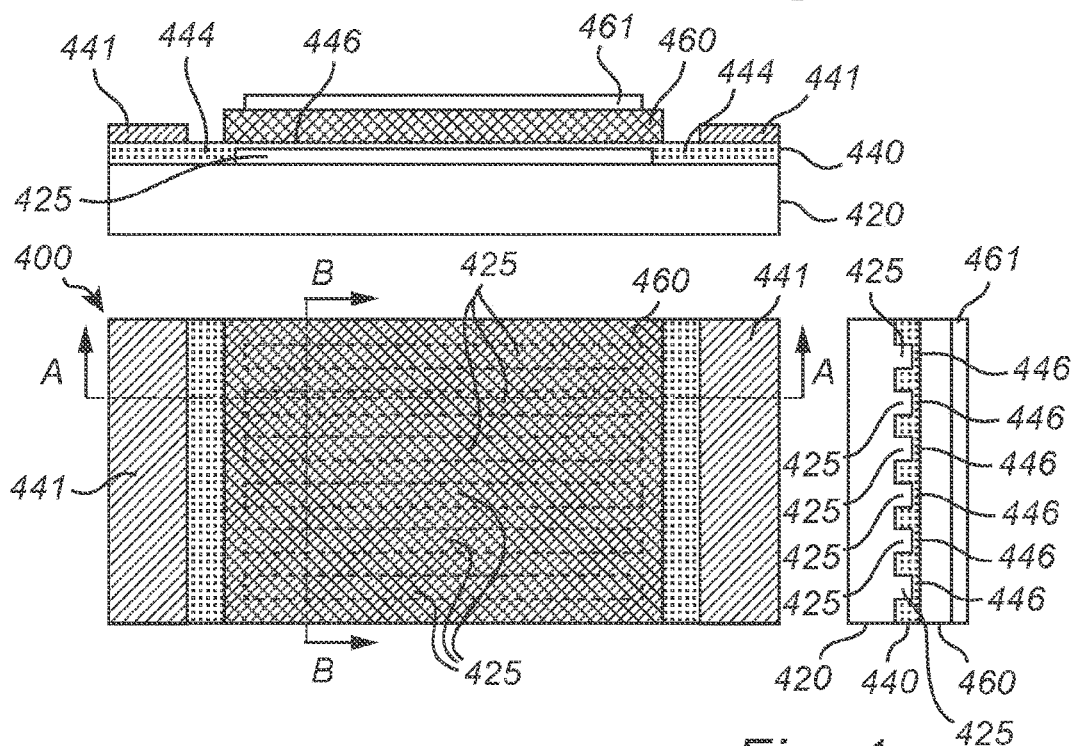
FIG. 4 shows a SiC BJT comprising a plurality of unit cells according to an embodiment.

With reference to FIG. 4, there is shown a schematic view of a SiC power device in accordance with an exemplifying embodiment. Cross sectional views are taken along the lines A-A and B-B of the top view (i.e., the lower left illustration).

FIG. 4 shows a SiC power device 400 comprising a single emitter mesa 460 used for a plurality of unit cells (BJTs). The structure and the operation principle of each unity cell are the same as the structure and operation principle of the SiC BJT 200 described with reference to FIG. 2. The SiC power device 400 comprises a collector layer 420, a base layer 440 and an emitter mesa 460 arranged as a stack. The base layer 440 comprises a plurality of first portions 446 formed as stripes underneath the emitter mesa 460, and shielding regions 444 laterally surrounding each first portion 446 and vertically extending further down in the stack than the first portion 446. Channel portions 425 are arranged between opposite shielding regions 444 and underneath each first portion 446. Each channel portion 425 is elevated into the base region 440. The emitter mesa 460 may preferably be significantly wider than the gap between shielding regions 444 of adjacent unit cells. The stripes of the first (low-dose) base portions 446 are oriented substantially perpendicular to the emitter mesa stripe 460.

Further, base contacts 441 and an emitter contact 461 are provided for electrically connecting the base 440 and the emitter 460, respectively. The dielectric passivation layer, the buffer layer, the substrate and the collector contact are omitted in FIG. 4 in order to not obscure the figure.

Figure 5A:
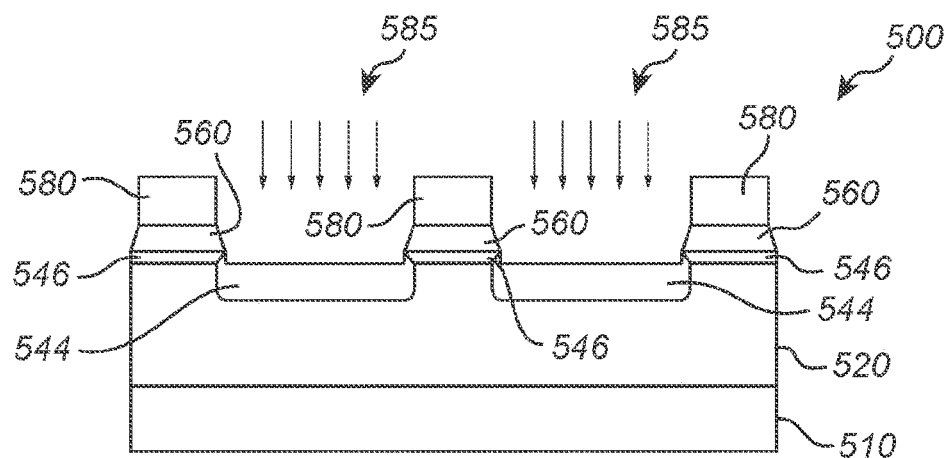
FIGS. 5A and 5B illustrate a method of manufacturing a SiC BJT according to an embodiment.
Figure 5B:
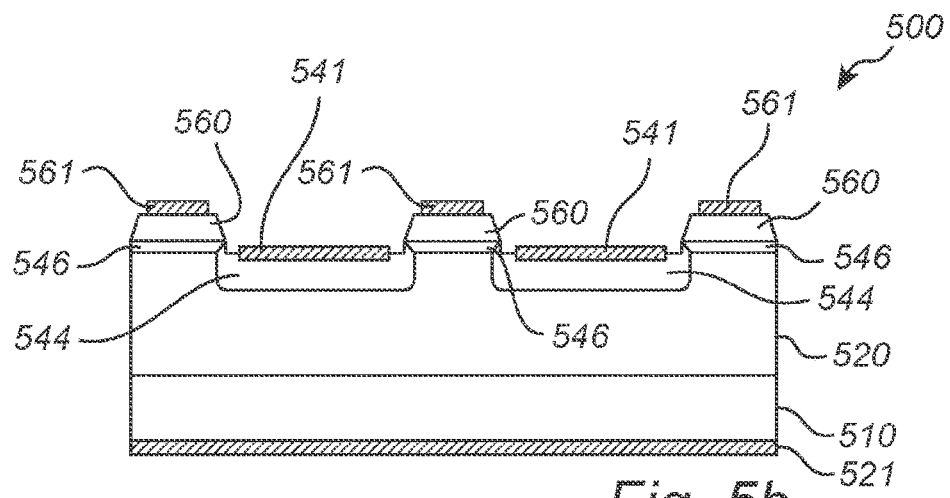

With reference to FIGS. 5A and 5B, a method of manufacturing a SiC BJT according an embodiment is illustrated. The basic structure and operation principle of the SiC BJT of FIGS. 5A and 5B are the same as the structure and operation principle of the SiC BJT 200 described with reference to FIG. 2.

According to the embodiment shown in FIGS. 5A and 5B, the shielding regions 544 of the SiC BJT 500 may be formed by ion implantation in the collector region 520. As shown in FIG. 5A, the emitter regions 560 may be protected (covered) with an ion implantation mask 580, and ions (e.g. aluminum ions) may subsequently be implanted into the portions of the collector region 520 not covered (or capped) by the emitter mesa 560 and the ion implantation mask 580. As a result, the shielding regions 544 are formed by the ion implanted regions of the collector region 520 laterally surrounding the first portion 546 of the intrinsic base region and vertically extending further down in the stack (and in the collector region 520) than the first portion 546. The ions are then activated by high temperature anneal and base contacts 541, emitter contacts 561 and a collector contact 521 are formed on the shielding regions 544 (contacting the base region), the emitter regions 560 and the backside of the substrate 510 on which the collector region 520 is disposed, respectively, as shown in FIG. 5B. Electrical connection from the base contacts 541 to the first portion 546 is enhanced by the lateral extension of the shielding regions 544 underneath the emitter mesa. The lateral extension may be provided by the lateral straggle and/or diffusion of implanted acceptor ions. The first portion 546 of the intrinsic base region may preferably include epitaxial material for enhancing the minority carrier lifetime. The epitaxial first portion 546 may be provided by epitaxially growing a base layer on the collector layer 520 (which in turn may be epitaxially grown on a substrate 510) prior to the ion implantation. The epitaxially grown extrinsic base portions may then, prior to ion implantation, optionally be completely removed by dry etch, or partly removed, wherein the penetration of implanted ions may exceed the thickness of the epitaxial extrinsic base layer (i.e. exceed down into the collector region 544).

With reference to FIG. 6A-6F, a method of manufacturing a SiC BJT according to another embodiment is illustrated. The basic structure and operation principle of the SiC BJT of FIG. 6A-6F are the same as the structure and operation principle of the SiC BJT 200 described with reference to FIG. 2.

According to the embodiment shown in FIG. 6A-6F, the shielding regions 644 of the SiC BJT 600 may be formed by epitaxial growth. An example of a sequence of steps for manufacturing a SiC BJT 600 comprising such epitaxially grown shielding regions 644 will be described in the following.

As shown in FIG. 6A, an $n^0$-type collector layer 620 is epitaxially grown on an $n^+$-type substrate 610 and subsequently patterned (e.g. by photolithographic technique) and etched for providing an elevated mesa structure 625 in the collector layer 620. The elevated mesa structure 625 is the portion of the collector region 620, which will become the channel portion 625 of the SiC BJT 600 shown in FIG. 6F. Subsequently, a p-type shielding layer 650 is epitaxially grown on the collector layer 620, such that an elevated mesa structure 655 is formed in the shielding layer 650 (as shown in FIG. 6B). For planarizing the stack formed by the substrate 610, the collector layer 620 and the shielding layer 650, a sacrificial layer 680 (such as an oxide layer) is deposited on the non-elevated portions of the shielding layer 650 (as shown in FIG. 6C). The sacrificial layer 680 and the elevated portion 655 of the shielding layer 650 are then removed by etching down to the elevated portion 625 of the collector layer 620, which results in a (substantially) plane structure as shown in FIG. 6D. The removal of the elevated portion 655 of the shielding layer 650 results in two shielding regions 644 on opposite sides of the elevated portion 625 of the collector layer 620. A p-type base layer 690 is then deposited on top of the shielding layer 650 and the elevated portion 625 of the collector layer 620, such that the base layer 690 and the shielding layer together form the base region 640 of the SiC BJT 600 (as shown in FIG. 6E). Further, an n⁻-type emitter layer 667 is deposited on the base layer 690. The emitter layer 667 is then patterned and etched to form an emitter mesa 660 aligned with the elevated portion 625 of the collector layer 620 (as shown in FIG. 6F). Hence, the emitter mesa 660 is positioned over the elevated portion, i.e. the channel portion, 625 of the collector layer 620 such that the portion of the base layer 690 located between the channel portion 625 and the emitter mesa 660 forms the first portion 646 being a part of the intrinsic base region. Preferably, the width of the channel portion 625 of the collector layer 620 may be narrower than the emitter mesa 660, such that portions of the shielding regions 644 laterally separate the first portion 646 from the outer edges of the emitter mesa 660.

The lateral (or substantially vertical) edges of the channel portion 625 may be slightly inclined, as shown in FIG. 6F. In this case, the width at approximately half the height H of the channel portion 625 may be used for determining a convenient aspect ratio of the channel portion 625. Generally, if the channel portion has a width varying with its vertical extension, the aspect ratio of the channel portion may preferably be determined based on the average width of the channel portion.

Subsequent manufacturing steps may be identical to those for conventional SiC BJTs.

It will be appreciated that the conductivity types of the different layers may be adapted as desired and that the above described is only an example of conductivity types which may be used for an NPN-type SiC BJT.

While specific embodiments have been described, the skilled person will understand that various modifications and alterations are conceivable within the scope as defined in the appended claims. For example, the shielding regions may be both epitaxially grown and ion implanted regions, wherein the SiC BJT may be manufactured by combining the manufacturing steps described with reference to FIGS. 5A and 5B with the manufacturing steps described with reference to FIG. 6A-6F.

Further, the SiC BJT may comprise more than one first portion of the intrinsic base region separated by one or more additional shielding regions. Consequently, the collector region may comprise more than one channel portion, as channel portions thus may be arranged underneath each first portion (and between adjacent shielding regions).

What is claimed is:

1. A silicon carbide (SiC) bipolar junction transistor (BJT), comprising:
   a collector region having a first conductivity type;
   a base region having a second conductivity type opposite the first conductivity type;
   an emitter region having the first conductivity type, the collector region, the base region and the emitter region being arranged as a stack, the emitter region defining an elevated structure defined at least in part by an outer sidewall on top of the stack,
   the base region having a portion capped by the emitter region and defining an intrinsic base region; and
   a first shielding region and a second shielding region each having the second conductivity type, the first shielding region being arranged on a laterally opposite side of a portion of the intrinsic base region from the second shielding region, the collector region having a portion defining a channel portion in the collector region and separating the first shielding region from the second shielding region below the portion of the intrinsic base region, the first shielding region having a dopant level at an interface with the channel portion greater than a dopant level of the portion of the intrinsic base region, the first shielding region extending to a further depth in the stack than the portion of the intrinsic base region and by a distance corresponding to about 15% to 150% of a width the channel portion.

2. The SiC BJT of claim 1, wherein the distance corresponds to about 40% to 60% of the width of the channel portion of the collector region separating the first shielding region from the second shielding region.

3. The SiC BJT of claim 1, wherein the first shielding region is at least one of an epitaxially grown region and an ion implanted region.

4. The SiC BJT of claim 1, wherein the first shielding region laterally extends from the portion of the intrinsic base region to outside the intrinsic base region.

5. The SiC BJT of claim 1, wherein the portion of the intrinsic base region is laterally spaced away from the outer sidewall of the emitter region by a portion of the first shielding region.

6. The SiC BJT of claim 1, wherein the first shielding region defines a part of the base region.

7. The SiC BJT of claim 1, wherein the SiC BJT is a NPN SiC BJT.

8. A SiC power device including a plurality of BJTs, each of the plurality of BJTs being configured as defined in claim 1, the plurality of BJTs being arranged as a one-dimensional array or as a two-dimensional array, the plurality of BJTs being connected via interconnect.

9. A unit cell of a power semiconductor device, comprising:
   a first region having a first conductivity type;
   a second region having a second conductivity type opposite the first conductivity type;
   a third region having the first conductivity type, the first region, the second region and the third region being arranged as a stack, the third region defining an elevated structure defined at least in part by an outer sidewall on top of the stack, the second region having a portion capped by the third region and defining an active region of the second region; and
   two shielding regions having the second conductivity type, the active region including a first portion and at least part of the two shielding regions, each of the two shielding extending further down in the stack than the active region and by a distance corresponding to about 15% to 150% of a width of a channel portion of the first region disposed between the two shielding regions and below the third region, the first portion of the active region having a dopant level less than a dopant level of one of the two shielding regions at an interface between the one of the two shielding regions and the channel portion.

10. A silicon carbide (SiC) bipolar junction transistor (BJT), comprising:
a collector region having a first conductivity type;
a base region having a second conductivity type opposite the first conductivity type;
an emitter region having the first conductivity type, the collector region, the base region and the emitter region being arranged as a stack, the emitter region defining an elevated structure defined at least in part by an outer sidewall on top of the stack, the base region having a portion capped by the emitter region and defining an intrinsic base region; and
two shielding regions having the second conductivity type and a dopant dose greater than a dopant dose of a portion of the intrinsic base region, each of the two shielding regions being arranged on laterally opposite sides of the portion of the intrinsic base region, each of the two shielding regions having a portion disposed directly below the emitter region and extending further down in the stack than the intrinsic base region, the two shielding regions being configured to provide shielding of an electric field in the portion of the intrinsic base region, the two shielding regions and the portion of the intrinsic base region each having an upper boundary below the emitter region.

11. The SiC BJT of claim 10, wherein the two shielding regions laterally surround the portion of the intrinsic base region.

12. The SiC BJT of claim 1, wherein the first shielding region and the portion of the intrinsic base region each have an upper boundary below the emitter region.

13. The SiC BJT of claim 1, wherein the first shielding region and the second shielding region laterally surround the portion of the intrinsic base region.

14. The unit cell of claim 9, wherein the two shielding regions and the first portion of the active region each have an upper boundary below the third region.

15. The unit cell of claim 9, wherein the two shielding regions are thicker than the first portion of the active region.

16. The unit cell of claim 9, wherein the two shielding regions laterally surround the first portion of the active region, the active region is in contact with the third region.

17. The unit cell of claim 9, wherein the first portion of the active region is laterally spaced away from the outer sidewall of the third region by a portion of at least one of the two shielding regions.

18. The SiC BJT of claim 1, wherein the first shielding region has a dopant level at an interface with the intrinsic base region greater than a dopant level of the Portion of the intrinsic base region.

19. The unit cell of claim 9, wherein each of the two shielding regions extend further down in the stack than any point of the first portion of the active region by the distance corresponding to about 40% to 60% of the width of the channel portion of the first region disposed between the two shielding regions.

20. The SiC BJT of claim 10, wherein the two shielding regions and the portion of the intrinsic base region define an interface with a bottom surface of the emitter region.

21. The SiC BJT of claim 10, wherein the collector region has a portion defining a channel portion in the collector region and separating the two shielding regions below the portion of the intrinsic base region, at least one of the two shielding regions has a dopant level at an interface with the channel portion greater than a dopant level of the portion of the intrinsic base region.

* * * * *